United States Patent
Yamazaki

(10) Patent No.: US 8,183,695 B2
(45) Date of Patent: May 22, 2012

(54) SEMICONDUCTOR DEVICE AND METHOD OF MANUFACTURING THE SAME

(75) Inventor: Toru Yamazaki, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 678 days.

(21) Appl. No.: 12/292,386

(22) Filed: Nov. 18, 2008

(65) Prior Publication Data

US 2009/0134523 A1    May 28, 2009

(30) Foreign Application Priority Data

Nov. 26, 2007  (JP) ................. 2007-305012

(51) Int. Cl.
*H01L 29/40* (2006.01)
(52) U.S. Cl. .................. 257/773; 257/779; 257/780
(58) Field of Classification Search .................. 257/773, 257/779, 780
See application file for complete search history.

(56) References Cited

U.S. PATENT DOCUMENTS 6,008,542 A    12/1999   Takamori

FOREIGN PATENT DOCUMENTS

| JP | 2-241046 | 9/1990 |
| JP | 11-74464 | 3/1999 |

*Primary Examiner* — Samuel Gebremariam
(74) *Attorney, Agent, or Firm* — McGinn IP Law Group, PLLC

(57) ABSTRACT

A semiconductor chip includes a semiconductor chip region provided with a plurality of internal circuits, and a plurality of electrode pads provided proximate to an outer edge of the semiconductor chip region and each electrically connected to any one of the plurality of internal circuits. The plurality of electrode pads include: a long pad including a probe region with which a probe is brought into contact, and a bonding region provided in a position different from a position of the probe region, for bonding a wire; and a short pad for high frequency, which is formed to have a smaller pad area compared with the long pad and inputs/outputs a high frequency signal by employing a structure including the bonding region but the probe region.

12 Claims, 8 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same.

2. Description of Related Art

In recent years, along with a reduction in chip size, an area of an electrode pad used in probing and bonding has also been reduced. Besides, a ball area at a tip of a wire (gold wire) in the case of bonding the wire to the electrode pad has also been reduced, and thus a contact area between the ball and the electrode pad has been reduced as well. Therefore, when an electrode pad having a small area is used, if there remains damage caused by a probe on a surface of the electrode pad, there arises a problem in that bonding strength in the case of bonding the wire to the electrode pad is decreased.

In order to prevent a decrease in bonding strength described above, there is used an electrode pad including a probe area with which the probe is brought into contact at a time of testing, and a bonding area for bonding the wire after testing, which is different from the probe area. JP 11-074464 A describes two pads each including an assembly pad and a probe pad in combination and having sizes different from each other. In JP 11-074464 A, positions of probe pads of adjacent pads are displaced from each other, which enables, in the case of manufacturing a test probe card, probing with a small pitch even in a case where a diameter of a root portion of the probe is large.

Further, JP 02-241046 A describes a structure in which a pad for wire bonding and a pad for a wafer prober, which has a larger area compared with the pad for wire bonding, are individually provided. The pad for a wafer prober is subjected to probing, and then a wire connecting the pad for a wafer prober and the pad for wire bonding to an internal circuit is cut off.

The present inventor has recognized as follows. When the bonding region and the probing region are provided in different portions of the electrode pad, an area of the electrode pad needs to be nearly doubled compared with the case of performing probing and bonding in the same portion. An increase in area of the electrode pad leads to an increase in parasitic capacitance between the electrode pad and a semiconductor substrate. In an electrode pad to be connected to a circuit in which high frequency characteristics are valued, such an increase in parasitic capacitance poses a problem.

SUMMARY

According to the present invention, there is provided a semiconductor device, including:

a semiconductor chip region provided with a plurality of internal circuits; and a plurality of electrode pads provided in proximity to an outer edge of the semiconductor chip region and each electrically connected to any one of the plurality of internal circuits, in which the plurality of electrode pads include:

a first electrode pad; and a second electrode pad for high frequency, which is formed to have a smaller pad area compared with the first electrode pad and inputs/outputs a high frequency signal.

Further, according to the present invention, there is provided a method of manufacturing the above-mentioned semiconductor device, including:

performing probing to test an internal circuit connected to a first electrode pad;

constructing the semiconductor device in a chip form, and bonding a wire to the first electrode pad and a second electrode pad to assemble a package; and running a test on the internal circuit connected to the first electrode pad and the second electrode pad via the wire.

With a structure described above, a parasitic capacitance between a pad inputting/outputting a high frequency signal and a semiconductor device can be reduced, whereby signals can be favorably exchanged between the internal circuit and the outside. Further, probing is not performed and only a test after assembly is run on the pad inputting/outputting a high frequency signal, and thus damage is not caused by the probe, which also prevents a bonding strength between the pad and the wire from reducing.

It should be noted that a semiconductor device or a method in which the above-mentioned components are appropriately combined or a description of the present invention is adapted therebetween is effective as an aspect of the present invention.

According to the present invention, an increase in parasitic capacitance of the electrode pad to be connected to the circuit in which high frequency characteristics are valued can be suppressed.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

Hereinafter, an embodiment of the present invention is described with reference to the drawings. It should be noted that similar components are denoted by similar reference symbols in the respective drawings, and their descriptions are appropriately omitted.

In this embodiment, a semiconductor device includes a semiconductor chip region provided with a plurality of internal circuits, and a plurality of electrode pads which are provided in the vicinity of an outer edge of the semiconductor chip region and are each electrically connected to any one of the plurality of internal circuits. In other words, the semiconductor device is constructed in a chip form, and then the electrode pad is provided in the vicinity of the chip end of the semiconductor chip. The plurality of electrode pads each have a function of bonding a wire for supplying a signal or power sent from the outside to the internal circuits provided on the semiconductor chip. In this embodiment, the plurality of electrode pads include an electrode pad for high frequency through which a high frequency signal is exchanged and an electrode pad through which power or a low frequency signal is exchanged, and an area of the electrode pad for high frequency can be made smaller compared with the electrode pad through which power or a low frequency signal is exchanged. It should be noted that a signal of 800 MHz or more can be regarded as the high frequency signal in this embodiment described below.

Figure 1A:
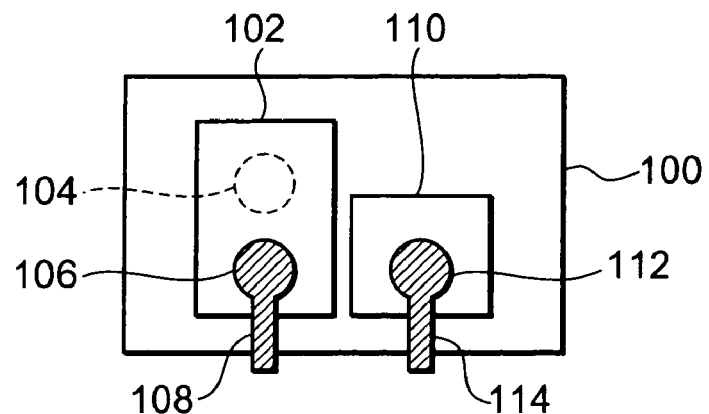
FIGS. 1A to 1C are plan views partially illustrating a structure of a semiconductor chip according to an embodiment of the present invention.
Figure 1B:
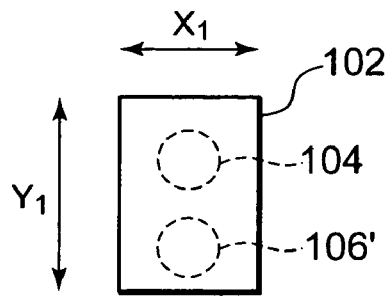
Figure 1C:
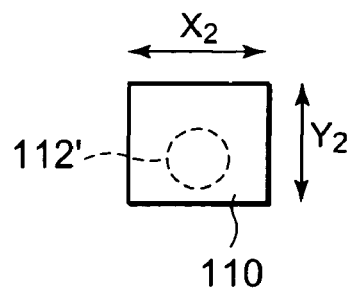

FIGS. 1A to 1C are plan views partially illustrating a structure of a semiconductor chip according to this embodiment. FIG. 1A is a view partially illustrating a vicinity of the chip end of the semiconductor chip. FIGS. 1B and 1C are plan views each illustrating structures of a long pad 102 and a short pad 110.

A semiconductor chip 100 includes the long pad (first electrode pad) 102 and the short pad (second electrode pad) 110. The long pad 102 is an electrode pad other than an electrode pad for high frequency, and the short pad 110 is an electrode pad for high frequency.

The long pad 102 includes a probe region 104 and a bonding region 106'. The bonding region 106' of the long pad 102 is provided with a ball 106, and a wire 108 is electrically connected to the long pad 102 by the ball 106. On the other hand, the short pad 110 has a smaller pad area compared with the long pad 102, includes only a bonding region 112', and does not include a probe region. The bonding region 112' of the short pad 110 is provided with a ball 112, and a wire 114 is electrically connected to the short pad 110 by the ball 112. The wire 108 and the wire 114 can be, for example, a gold wire.

In this case, it is assumed that the long pad 102 and the short pad 110 are arranged so as to have a width in a direction along a chip end (outer edge of the semiconductor chip region) of the semiconductor chip and a length in a direction perpendicular to the above-mentioned direction. In this state, assuming that the width and the length of the short pad 110 are X2 and Y2, respectively, X2 and Y2 are set in accordance with a diameter of the ball 112. The diameter of the ball 112 varies depending on progress of an assembly technology or a probing technology, and X2 and Y2 can be set to, for example, 1.5 times the diameter of the ball 112 or less.

As a pad area of the long pad 102 is larger, a portion in which the ball is formed is more easily distinguished from a portion in which probing is performed, which is advantageous in assembling. On the other hand, it is desirable that a parasitic capacitance between the pad and a substrate be suppressed to be small in the long pad 102. Thus, the pad area of the long pad 102 is desirably made as small as possible in order to make the semiconductor chip 100 finer. Assuming that the width and the length of the long pad 102 are X1 and Y1, respectively, the width X1 of the long pad 102 is set in accordance with a diameter of the ball 106. The diameter of the ball 112 also varies depending on progress of the assembly technology or the probing technology. X1 can be set to, for example, 1.5 times the diameter of the ball 106 or less.

The length Y1 of the long pad 102 is set to be larger than the length Y2 of the short pad 110. The length Y1 of the long pad 102 can be set to be 1.5 times the length Y2 of the short pad 110 or more. Accordingly, even when probing is performed, the ball can be prevented from peeling off. The length Y1 of the long pad 102 is set to be twice the length Y2 of the short pad 110 or less. Accordingly, the parasitic capacitance can be suppressed and also the size of the semiconductor chip 100 can be maintained small.

Figure 8:
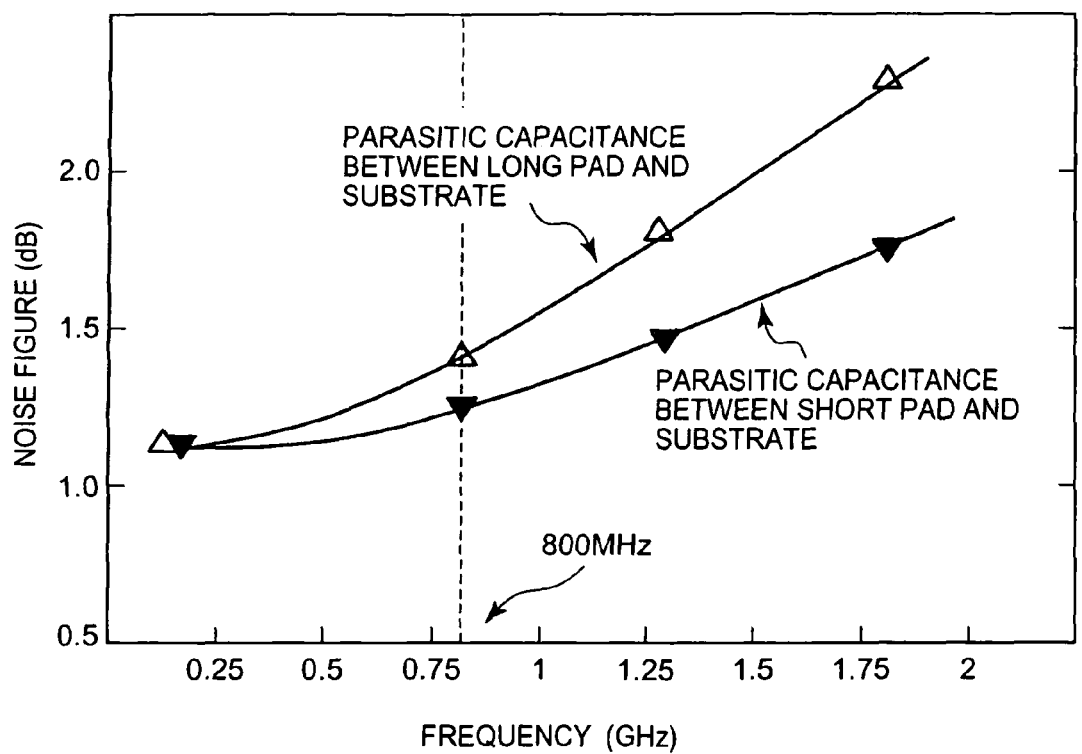
FIG. 8 is a graph showing a relationship between a frequency (GHz) and a noise figure (dB) of a low noise amplifier (LNA) in a case where the long pad and the short pad are used as input pads for supplying a signal to the LNA required to have high-performance characteristics in a high frequency circuit.

FIG. 8 is a graph showing of a relationship between a frequency (GHz) and a noise figure (dB) of a low noise amplifier (LNA) in the case where the long pad 102 and the short pad 110 are used as input pads for supplying a signal to the LNA required to have high-performance characteristics in a high frequency circuit. In this case, the long pad 102 is configured to have the same width as that of the short pad 110 and the length twice the length of the short pad 110.

It is revealed that, when the frequency is equal to or more than 800 MHz, there is a difference in noise figure by 10% or more between the case where the long pad 102 is used as the input pad and the case where the short pad 110 is used as the input pad. In view of the above, the short pad 110 is preferably used as the electrode pad for inputting/outputting a high frequency signal having a frequency of 800 MHz or more.

Figure 2:
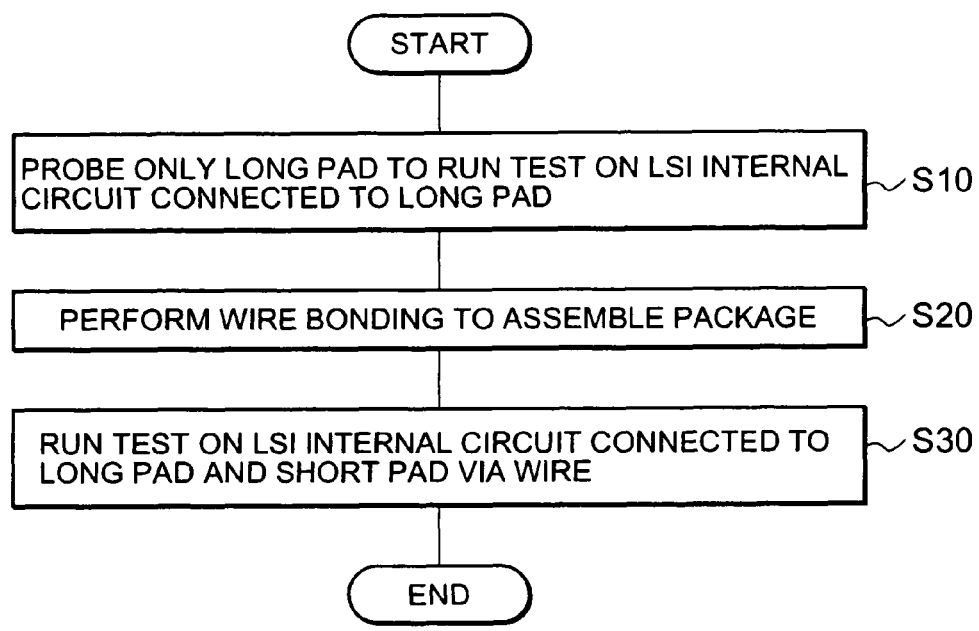
FIG. 2 is a flowchart showing a manufacturing procedure of the semiconductor chip according to the embodiment of the present invention.

FIG. 2 is a flowchart showing a manufacturing procedure of the semiconductor chip 100 according to this embodiment.

In this embodiment, first, only the long pad 102 is subjected to probing on a semiconductor wafer to run a test on an internal circuit connected to the long pad 102 (S10). Then, the semiconductor device is constructed in a chip form, and the long pad 102 and the short pad 110 are subjected to wire bonding, thereby assembling a package (S20). After that, a test is run on an internal circuit connected to the long pad 102 and the short pad 110 via a wire (S30).

In other words, in this embodiment, the high frequency characteristics are not determined in the wafer state, but determined after the assembly of the package. As a result, the short pad 110 for high frequency does not need to be provided with the probe region, whereby the area of the short pad 110 can be reduced. Besides, damage caused by the probe is not brought about on the short pad 110, and thus a bonding strength of the wire 114 can be maintained high.

Next, with reference to FIG. 3 to FIGS. 7A and 7B, a description is made of specific examples of arrangements of the long pad 102 and the short pad 110 in the semiconductor chip 100. The respective examples have advantages, and a desirable arrangement is appropriately adopted in accordance with a type of the semiconductor chip 100 to be applied.

Figure 3:
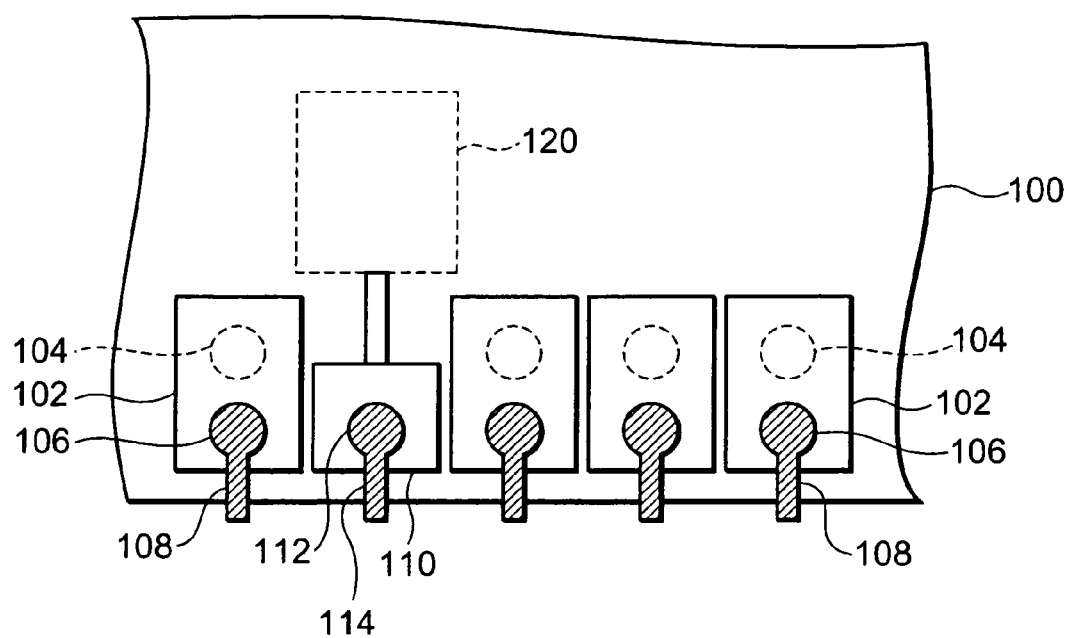
FIG. 3 is a view illustrating a specific example of arrangements of a long pad and a short pad in the semiconductor chip according to the embodiment of the present invention.

FIG. 3 is a plan view illustrating an example where the long pads 102 and the short pad 110 are arranged in the same line at the chip end of the semiconductor chip 100. The short pad 110 is connected to a high frequency circuit region 120. In this case, one wire is bonded to each of the long pads 102 and the short pad 110.

Figure 4A:
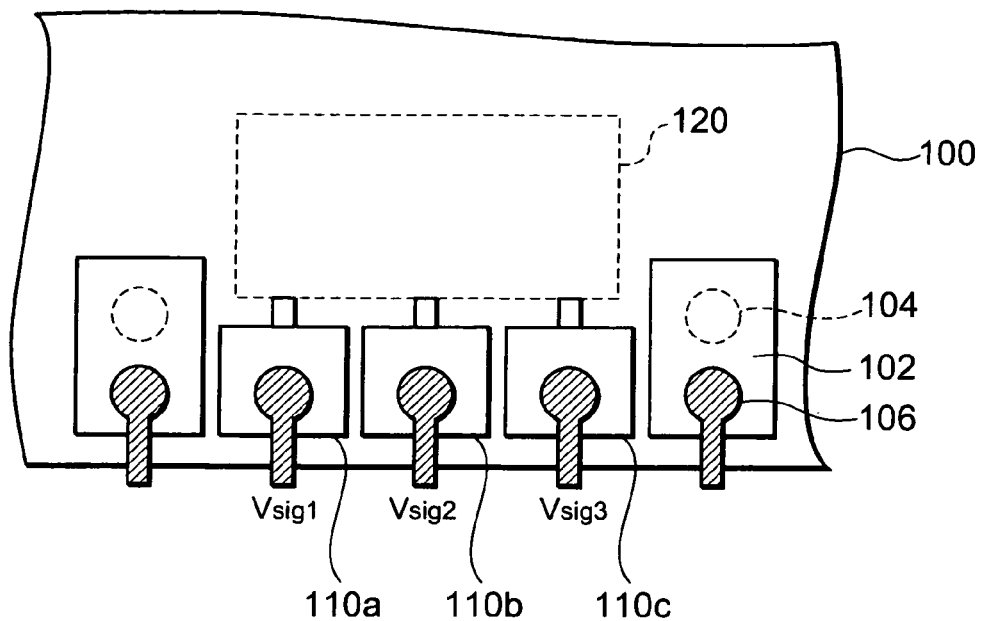
FIGS. 4A and 4B are views illustrating specific examples of the arrangements of the long pad and the short pad in the semiconductor chip according to the embodiment of the present invention.
Figure 4B:
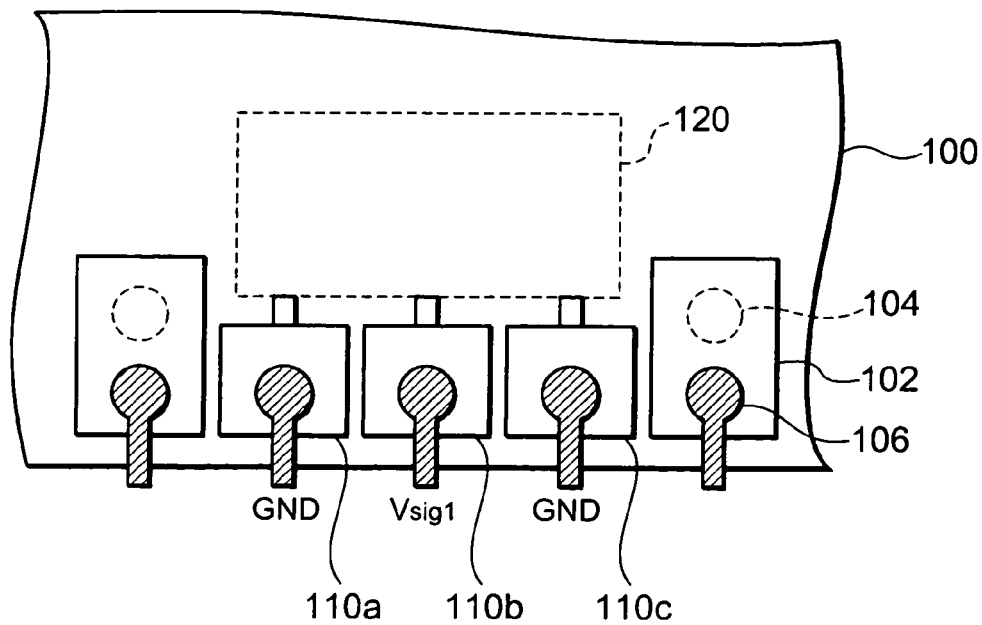

FIGS. 4A and 4B are plan views illustrating structures in which three short pad 110 (first short pad 110a, second short pad 110b, and third short pad 110c) are arranged in a line along one end of the semiconductor chip 100 in the vicinity of the one end thereof. Also in this example, the long pads 102 and the short pads 110 are arranged in the same lien at the chip end of the semiconductor chip 100. Also in this case, one wire is bonded to each of the long pads 102 and the short pads 110.

In FIG. 4A, the first short pad 110a, the second short pad 110b, and the third short pad 110c are applied with signals, that is, Vsig1, Vsig2, and Vsig3, respectively. With such a structure, a parasitic capacitance between the pad inputting/outputting a high frequency signal and the substrate can be reduced.

Figure 5:
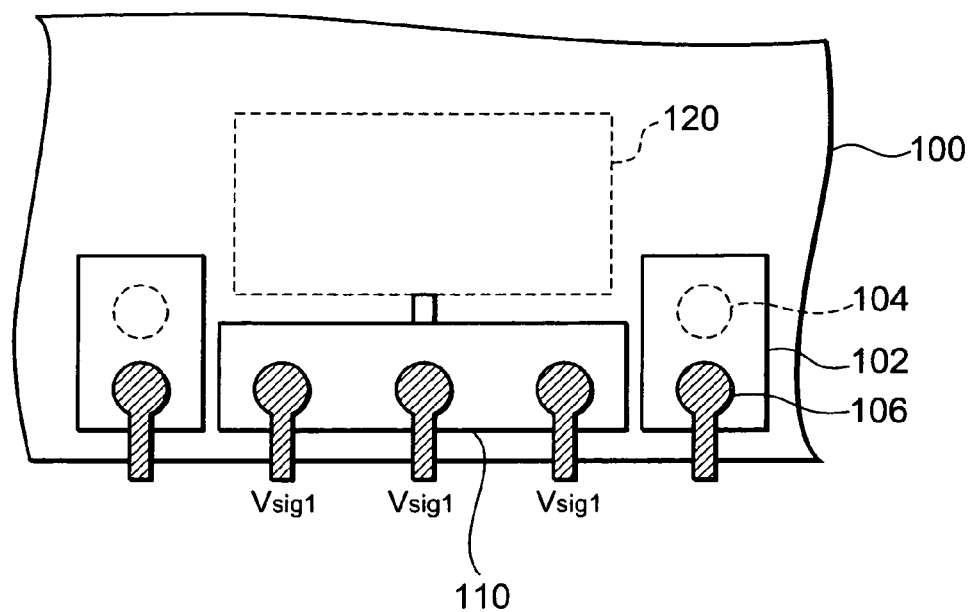
FIG. 5 is a view illustrating a specific example of the arrangements of the long pad and the short pad in the semiconductor chip according to the embodiment of the present invention.

Further, in the case of applying the same signal (for example, Vsig1) via a plurality of wires, the short pad 110 can be configured to have a large width so that the plurality of wires are pulled out from one short pad 110. An example of the above is illustrated in FIG. 5. Also in this case, assuming that the number of the wires to be pulled out is n and that a diameter of the ball 112 is d, the short pad 110 can be set to have the width X2 of n×d×1.5 or less. Further, the length Y2 of the short pad 110 can be set to be 1.5 times the diameter d of the ball 112 or less. Also with the above-mentioned structure, the length and the pad area per wire of the short pad 110 can be made smaller compared with the long pad 102, with the result that the parasitic capacitance can be reduced. Further, three leads of the signal Vsig1 which is one of the three signals are connected in parallel, whereby a parasitic capacitance and a parasitic inductance of the leads can be reduced.

Further, as illustrated in FIG. 4B, the first short pad 110a and the third short pad 110c arranged at both ends of the line of the three short pads 110 can be applied with a ground potential (GND). In this case, only the second short pad 110b arranged as a middle one of the three short pads 110 is applied with a signal (for example, Vsig1). With the above-mentioned structure, the second short pad 110b and the high frequency circuit region 120 to be connected to the second short pad 110b can be shielded from surrounding long pads 102 and other circuit. It should be noted that the example in which only three short pads 110 are used is described in this case. However, four or more of the short pads 110 can be used, the short pads 110 arranged at both ends of the line can be applied with a ground potential, and the plurality of short pads 110 arranged between the both ends can be applied with a signal. Further, four or more of the short pads 110 can be used, and pads to be applied with a ground potential and pads to be applied with a signal can be alternately arranged.

Figure 6A:
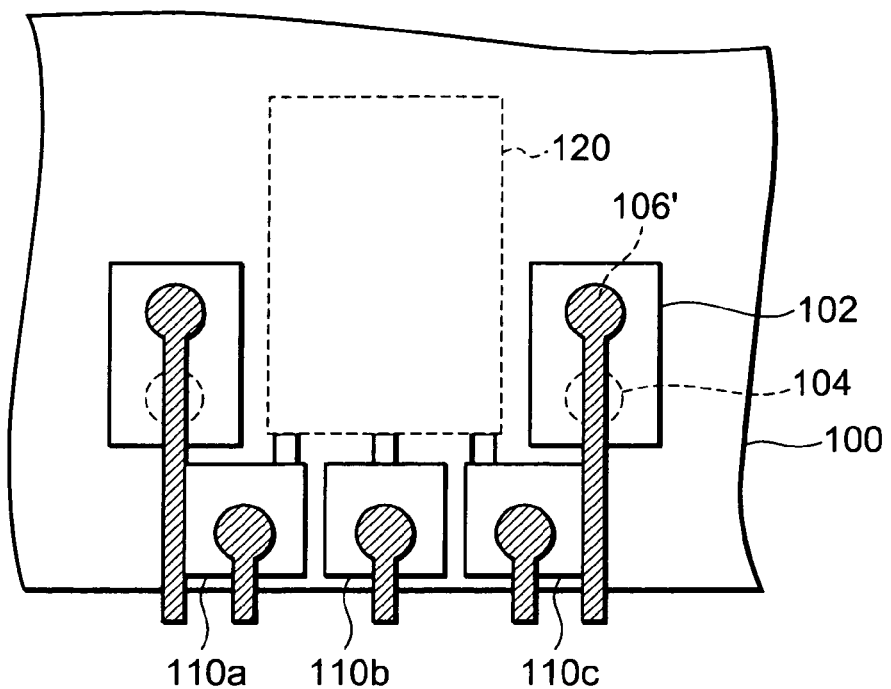
FIGS. 6A and 6B are views illustrating specific examples of the arrangements of the long pad and the short pad in the semiconductor chip according to the embodiment of the present invention.
Figure 6B:
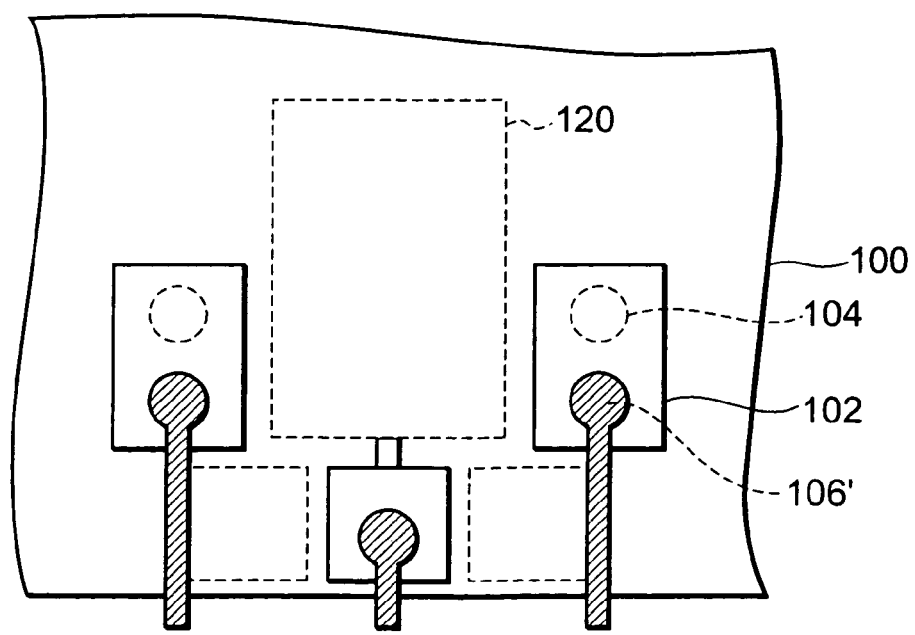

FIGS. 6A and 6B are plan views illustrating examples in which the long pads 102 are provided in inner portions of the semiconductor chip 100 compared with the short pads 110.

As in the case illustrated in FIG. 4A and FIG. 4B, FIG. 6A is a plan view illustrating a structure in which the three short pads 110 (first short pad 110a, second short pad 110b, and third short pad 110c) are arranged in a line. In this example, the first short pad 110a, the second short pad 110b, and the third short pad 110c are arranged in a line at the chip end of the semiconductor chip 100. On the other hand, the long pads 102 are provided in the inner portions of the semiconductor chip 100 compared with the first short pad 110a, the second short pad 110b, and the third short pad 110c. Further, the long pads 102 are arranged in a staggered shape so as to overlap the first short pad 110a or the third short pad 110c in a width direction. Accordingly, many pads can be arranged, and thus the semiconductor chip configured as described above can be applied to a product which has many pins while being miniaturized. Even with the arrangement described above, if a position coordinate for wire bonding is input to a bonder in advance, bonding can be performed without any problems in assembly.

Even with the above-mentioned structure, the first short pad 110a, the second short pad 110b, and the third short pad 110c may be applied with the same signal, or only the second short pad 110b may be applied with a signal while the first short pad 110a and the third short pad 110c may be applied with a ground potential.

FIG. 6B is a view illustrating an example in which the first short pad 110a and the third short pad 110c having the structure illustrated in FIG. 6A are removed. When the short pads adjacent to the second short pad 110b are removed in this manner, a parasitic capacitance between the second short pad 110b and the surrounding pads can be reduced. It should be noted that, as for the bonding region 106' and the probe region 104 in the long pad 102, the probe region 104 may be arranged at the chip end side as illustrated in FIG. 6A, or the bonding region 106' may be arranged at the chip end side as illustrated in FIG. 6B.

Figure 7A:
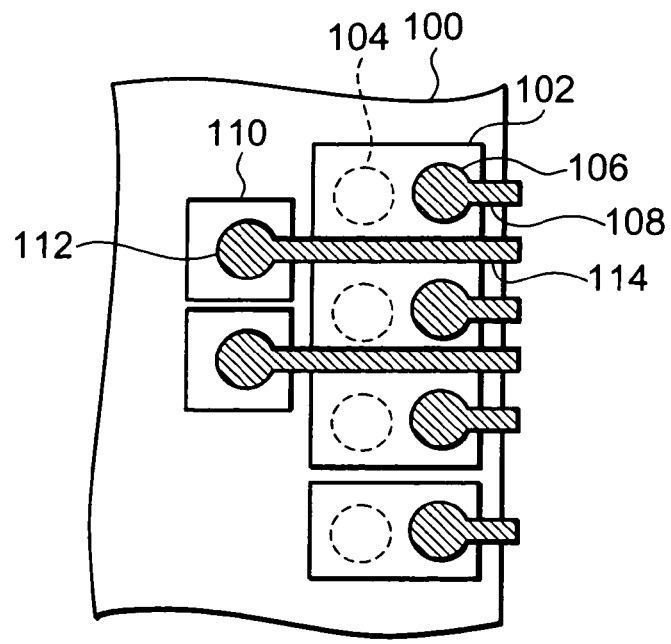
FIGS. 7A and 7B are views illustrating specific examples of the arrangements of the long pad and the short pad in the semiconductor chip according to the embodiment of the present invention.
Figure 7B:
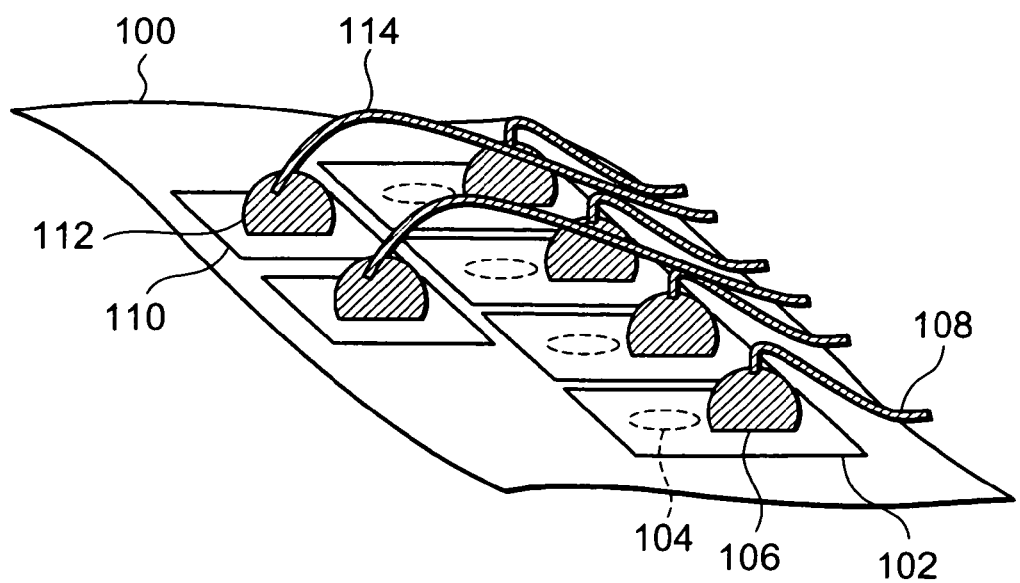

FIGS. 7A and 7B are views illustrating an example in which the short pads 110 are provided in the inner portions of the semiconductor chip 100 compared with the long pads 102. FIG. 7A is a plan view, and FIG. 7B is a perspective view.

In FIGS. 7A and 7B, the plurality of long pads 102 are arranged in a line at the chip end of the semiconductor chip 100, and the short pads 110 are arranged in the inner portions of the semiconductor chip 100 compared with the long pads 102. The plurality of short pads 110 and the plurality of long pads 102 are arranged in a staggered shape. Accordingly, many pads can be arranged, and thus the semiconductor chip configured as described above can be applied to a product which has many pins while being miniaturized.

Further, with the structure described above, a length of wiring between the short pads 110 and the high frequency circuit region 120 can be made small, whereby a parasitic capacitance, a parasitic resistance, and a parasitic inductance of the wiring connecting the short pad 110 and the high frequency circuit region 120 can be effectively reduced. On the other hand, a length of the wire 114 between the short pad 110 and a stitch located outside the semiconductor chip 100 can be made large, and thus the wire 114 can be routed long in a big loop between the short pad 110 and the stitch, which makes impossible to add an inductance. For example, in the case where a gold lead having a diameter of about 25 μmφ is used as the wire 114, an inductance of about 0.8 nH/mm can be obtained. Accordingly, as illustrated in FIGS. 7A and 7B, in the case where the short pads 110 are arranged in the inner portion of the semiconductor chip 100 and a distance between the short pad 110 and the stitch is set to about 5 to 6 mm, an inductance of about 4 to 5 nH can be obtained.

It should be noted that, in the respective specific examples described in the embodiment described above, the structure can be made so that a circuit such as an input/output protection circuit is not provided below the short pad 110 for high frequency. As a result, the parasitic capacitance or the like between the short pad 110 and the circuit can be prevented from being generated. On the other hand, the circuit such as the input/output protection circuit may be provided below the long pad 102 in order to reduce the chip area.

As described above, according to the structure of the semiconductor chip 100 and the manufacturing method (testing method) for the semiconductor chip 100 of this embodiment, the parasitic capacitance of a pad for inputting/outputting a high frequency signal can be reduced, with the result that a signal can be exchanged favorably between the internal circuit and the outside. Further, in the pad inputting/outputting a high frequency signal, only a test after assembly is run without performing probing, and hence damage caused by the probe is not brought about, which prevents the bonding strength between the pad and the wire from reducing.

It is apparent that the present invention is not limited to the above embodiments, but may be modified and changed without departing from the scope and spirit of the invention.

What is claimed is:

1. A semiconductor device, comprising:
a semiconductor chip region provided with a plurality of internal circuits; and
a plurality of electrode pads provided in a proximity to an outer edge of the semiconductor chip region and each electrically connected to one of the plurality of internal circuits,
wherein the plurality of electrode pads includes:
a plurality of first electrode pads; and
a plurality of second electrode pads each having a smaller pad area compared with each of the plurality of the first electrode pads,
wherein the plurality of the first electrode pads is arranged in a row at a chip end of the semiconductor chip, and the plurality of the second electrode pads is arranged in inner portions of the semiconductor chip compared with the plurality of the first electrode pads, and
wherein the plurality of the second electrode pads and the plurality of the first electrode pads are arranged in a staggered shape.

2. A semiconductor device according to claim 1, wherein one of the plurality of first electrode pads includes:
a probe region with which a probe is brought into contact; and
a bonding region provided in a position different from a position of the probe region, for bonding a wire, and
wherein one of the plurality of second electrode pads includes the bonding region and is devoid of the probe region.

3. A semiconductor device according to claim 1, wherein the plurality of the second electrode pads comprises at least three second electrode pads arranged in a proximity to one end of the semiconductor chip region and in line along the one end, and
wherein among the at least three second electrode pads, the plurality of the second electrode pads arranged at both ends of the line are applied with a ground potential.

4. A method of manufacturing the semiconductor device according to claim 1, said method comprising:
performing probing to test an internal circuit connected to the plurality of the first electrode pads;
constructing the semiconductor device in a chip form, and bonding a wire to the plurality of the first electrode pads and the plurality of the second electrode pads to assemble a package; and
running a test on the internal circuit connected to the plurality of the first electrode pads and the plurality of the second electrode pads via the wire.

5. A semiconductor device according to claim 1, wherein said each of the plurality of first electrode pads comprises:
a probe region with which a probe is brought into contact; and
a bonding region provided in a position different from a position of the probe region, for bonding a wire, and
wherein said each of the plurality of second electrode pads includes the bonding region and is devoid of the probe region.

6. A semiconductor device according to claim 1, wherein, in said row, said each of the plurality of first electrode pads is located adjacent to one of the plurality of first electrode pads.

7. A semiconductor device according to claim 6, wherein said each of the plurality of second electrode pads is arranged in an other row located above said row.

8. A semiconductor device according to claim 1, wherein said each of the plurality of first electrode pads comprises:
a probe region with which a probe is brought into contact; and
a bonding region for bonding a wire, said probe region being located closer to the plurality of second electrode pads than the probe region.

9. A semiconductor device according to claim 8, wherein said each of the plurality of second electrode pads includes the bonding region and is devoid of the probe region.

10. A semiconductor device according to claim 1, wherein the plurality of the first electrode pads and the plurality of the second electrode pads are arranged so as to have a width in a direction along the outer edge of the semiconductor chip region and a length in a direction perpendicular to the direction along the outer edge of the semiconductor chip region, and
wherein the length of said each of the plurality of the second electrode pads is shorter than the length of said each of the plurality of the first electrode pads.

11. A semiconductor device according to claim 10, wherein said each of the plurality of the second electrode pads is formed, in accordance with a diameter d of a ball to which a wire is bonded, so as to have the length of d×1.5 or less.

12. A semiconductor device according to claim 10, wherein the plurality of the first electrode pads and the plurality of the second electrode pads are formed in accordance with a number n of wires bonded to the plurality of the first electrode pads and the plurality of the second electrode pads, and a diameter d of a ball to which each of the wires is bonded, so as to have the width of n×d×1.5 or less.

* * * * *